(12) United States Patent
Fujimoto

(10) Patent No.: US 11,141,970 B2
(45) Date of Patent: Oct. 12, 2021

(54) SCREEN PRINTING DEVICE

(71) Applicant: YAMAHA HATSUDOKI KABUSHIKI KAISHA, Iwata (JP)

(72) Inventor: Takeshi Fujimoto, Shizuoka (JP)

(73) Assignee: YAMAHA HATSUDOKI KABUSHIKI KAISHA, Iwata (JP)

(*) Notice: Subject to any disclaimer, the term of this patent is extended or adjusted under 35 U.S.C. 154(b) by 0 days.

(21) Appl. No.: 16/960,871

(22) PCT Filed: Jan. 10, 2018

(86) PCT No.: PCT/JP2018/000288
§ 371 (c)(1),
(2) Date: Jul. 8, 2020

(87) PCT Pub. No.: WO2019/138464
PCT Pub. Date: Jul. 18, 2019

(65) Prior Publication Data
US 2020/0331257 A1 Oct. 22, 2020

(51) Int. Cl.
B41F 15/34 (2006.01)
B41F 15/14 (2006.01)
B41F 15/08 (2006.01)

(52) U.S. Cl.
CPC .......... B41F 15/34 (2013.01); B41F 15/0804 (2013.01)

(58) Field of Classification Search
CPC ........... B41F 15/14; B41F 15/34; B41F 15/36
See application file for complete search history.

(56) References Cited

U.S. PATENT DOCUMENTS

2012/0304876 A1   12/2012   Miyake et al.
2014/0190361 A1    7/2014   Satou
2016/0347049 A1   12/2016   Satou

FOREIGN PATENT DOCUMENTS

| CN | 101850649 A | 10/2010 |
| CN | 102806753 A | 12/2012 |
| CN | 103619594 A | 3/2014 |
| JP | H05-299812 A | 11/1993 |
| JP | H06-071847 A | 3/1994 |
| JP | 2001-253042 A | 9/2001 |
| JP | 3401798 B2 | 4/2003 |

(Continued)

OTHER PUBLICATIONS

International Search Report issued in PCT/JP2018/000288; dated Mar. 13, 2018.

Primary Examiner — Leslie J Evanisko
(74) Attorney, Agent, or Firm — Studebaker & Brackett PC

(57) ABSTRACT

A screen printing device includes a printing work part; a mask storage part including a plurality of accommodating sections each capable of accommodating a screen mask; a transfer device that transfers the screen mask between each of the accommodating sections and the printing work part; a pair of first guide members that is disposed in the printing work part, and guides the screen mask during the transfer, the pair of first guide members having a variable interval; a pair of second guide members that is disposed in the accommodating sections, and guides the screen mask during the transfer; and a guide width determination device that determines whether or not the interval between the pair of first guide members coincides with the interval between the pair of second guide members.

6 Claims, 10 Drawing Sheets

(56) References Cited

FOREIGN PATENT DOCUMENTS

| | | | |
|---|---|---|---|
| JP | 2008-260214 A | 10/2008 | |
| JP | 2010-131792 A | 6/2010 | |
| JP | 51-83957 B2 | 4/2013 | |
| WO | 2009/139745 A1 | 11/2009 | |
| WO | 2017/212541 A1 | 12/2017 | |
| WO | WO-2019225002 A1 * | 11/2019 | .......... B41F 15/0881 |

\* cited by examiner

SCREEN PRINTING DEVICE

CROSS-REFERENCE TO RELATED APPLICATION

This application is a National Stage of International Patent Application No. PCT/JP2018/000288, filed Jan. 10, 2018, the entire content of which is incorporated herein by reference.

BACKGROUND

Technical Field

The present disclosure relates to a screen printing device that applies a paste such as a cream solder or the like to a substrate such as a printed circuit board or the like.

Background Art

Conventionally, there has been known a screen printing device that applies (prints) a paste on a substrate through an opening (mask opening) formed in a screen mask by superimposing the screen mask on a printed circuit board or the like, and moving the paste such as a cream solder or the like on the screen mask with a squeegee.

In this type of screen printing device, it is necessary to replace the screen mask in accordance with a type of the substrate, and for example, as disclosed in Japanese Patent No. 3401798, a screen printing device capable of automatically replacing the screen mask in accordance with the type of the substrate has been developed.

This screen printing device includes a mask accommodating section in which a plurality of types of screen masks are accommodated in a plurality of upper and lower stages, and a conveyance device that conveys the screen masks. Although not explicitly mentioned, it is conceivable that each of a printing work part and the mask accommodating section is provided with a pair of guide members that supports and guides both ends of each of the screen masks, and that the screen mask moves between the printing work part and the mask accommodating section along the pair of guide members.

Meanwhile, in the screen printing device having a function of automatically replacing the screen mask, it is conceivable to selectively use a plurality of types of screen masks having mutually different sizes. In this case, it is necessary to change an interval between the pair of guide members on a printing work part side in accordance with a size of the screen mask. Therefore, if the change of the interval is not performed properly, a device trouble will be caused immediately. For example, when the screen mask is transferred from the mask accommodating section to the printing work part, if the interval between the pair of guide members on the printing work part side is smaller than the screen mask, there is a possibility of inducing a trouble that the screen mask collides with the relevant guide member, and that the screen mask is damaged or the like. Accordingly, it is required to avoid such a trouble beforehand, but Japanese Patent No. 3401798 does not disclose or suggest such a configuration.

SUMMARY

Accordingly, the present disclosure provides a technique for preventing occurrence of a trouble attributed to an improper adjustment of an interval between guide members for guiding a screen mask in a screen printing device having a function of automatically replacing the screen mask.

A screen printing device of the present disclosure includes a printing work part in which printing work is executed; a mask storage part that is disposed on a side of the printing work part and includes a plurality of accommodating sections each capable of accommodating a screen mask; a transfer device that moves the screen mask in a first direction to transfer the screen mask between each of the accommodating sections of the mask storage part, and the printing work part, the first direction being horizontal; a pair of first guide members that is disposed at an interval in a second direction orthogonal to the first direction in the printing work part, and guides the screen mask during the transfer, the pair of first guide members having a variable interval; a pair of second guide members that is disposed at an interval in the second direction orthogonal to the first direction in each of the accommodating sections of the mask storage part, and guides the screen mask during the transfer; and a guide width determination device that determines whether or not the interval between the pair of first guide members coincides with the interval between the pair of second guide members before the transfer of the screen mask by the transfer device is started.

DETAILED DESCRIPTION

Figure 1:
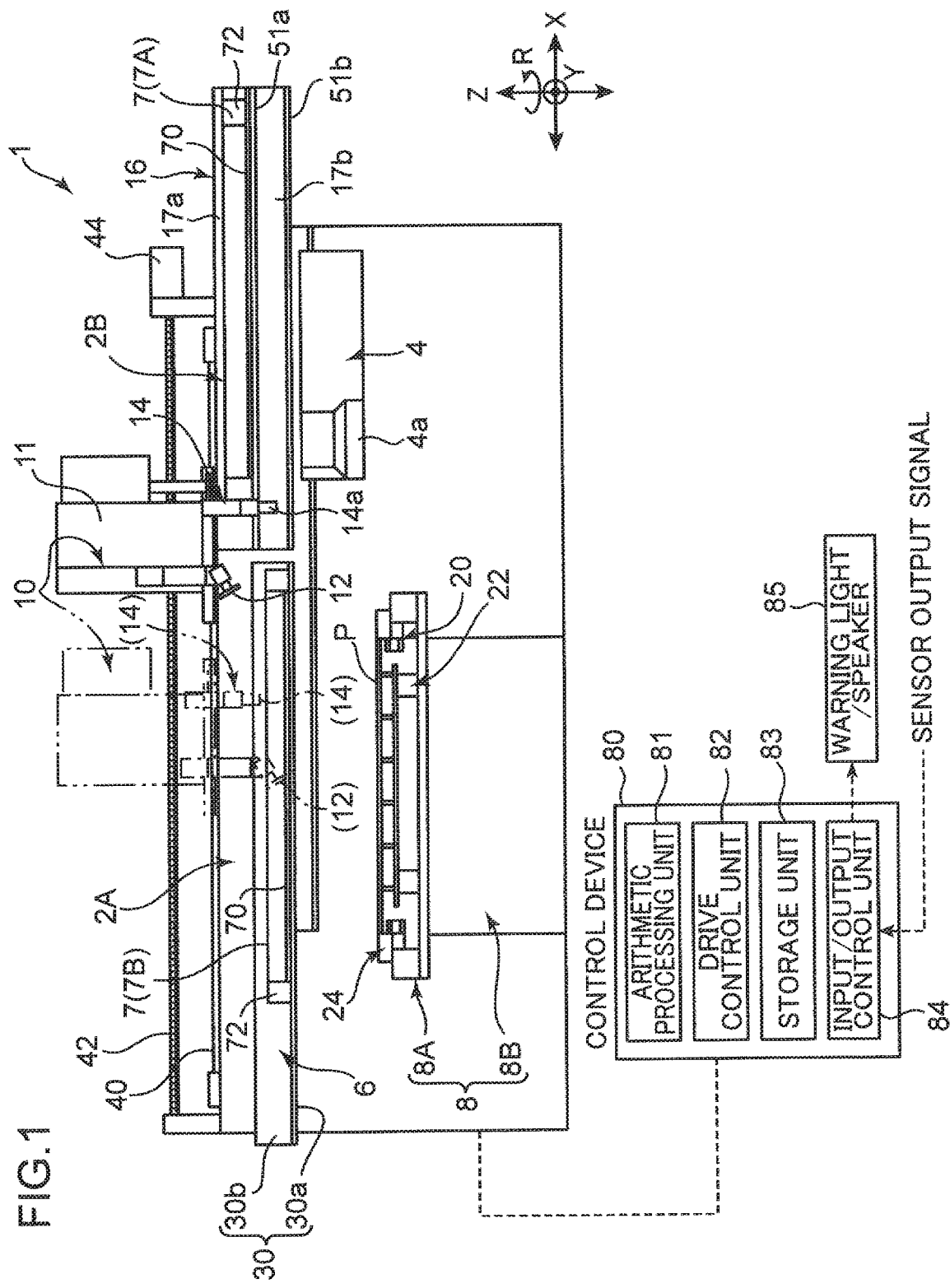
FIG. 1 is a schematic configuration diagram (side view) of a screen printing device according to an embodiment of the present disclosure.

FIG. 1 is a schematic configuration diagram (side view) of a screen printing device 1 according to an embodiment of the present disclosure. Noted that XYZ orthogonal coordinate axes are shown in FIG. 1 to clarify directional relationships. An X direction is a horizontal direction, a Z direction is a vertical direction, and a Y direction is a direction orthogonal to both the X direction and the Z direction.

The screen printing device 1 (hereinafter referred to as a printing device 1 in short) includes a printing work part 2A where a substrate P such as a printed circuit board is subjected to printing, and a mask storage part 2B that is disposed on a side of the printing work part 2A and stores a screen mask for replacement. The printing work part 2A and the mask storage part 2B are disposed adjacent to each other in the X direction.

The printing work part 2A includes a mask holding unit 6, a substrate holding unit 8, and a printing unit 10.

The substrate holding unit 8 includes an upper unit 8A and a lower unit 8B. The upper unit 8A holds the substrate P during printing work. The upper unit 8A includes a conveyor 20 for conveying the substrate P, a substrate support mechanism 22 that lifts the substrate P from the conveyor 20 and supports the substrate P, and a substrate clamping mechanism 24 that clamps the substrate P lifted from the conveyor 20 by the substrate support mechanism 22. The substrate P is loaded onto the conveyor 20 from an upstream side in the Y direction (back side in the direction orthogonal to a plane of FIG. 1), and is held by the mechanisms 22 and 24 while being positioned in the upper unit 8A. After printing processing, this positioning state is released, and the substrate P is carried out on a downstream side in the Y direction (front side in the direction orthogonal to the plane of FIG. 1) by the conveyor 20.

The lower unit 8B moves the substrate P positioned on the upper unit 8A together with the upper unit 8A. Although a detailed view is omitted, the lower unit 8B is configured of a table and a drive mechanism using a servomotor as a drive source to displace the table in the X, Y, Z directions, and an R direction. The upper unit 8A is fixed on the table. With this configuration, the substrate holding unit 8 moves the substrate P in each of the X, Y, Z, and R directions.

Figure 2:
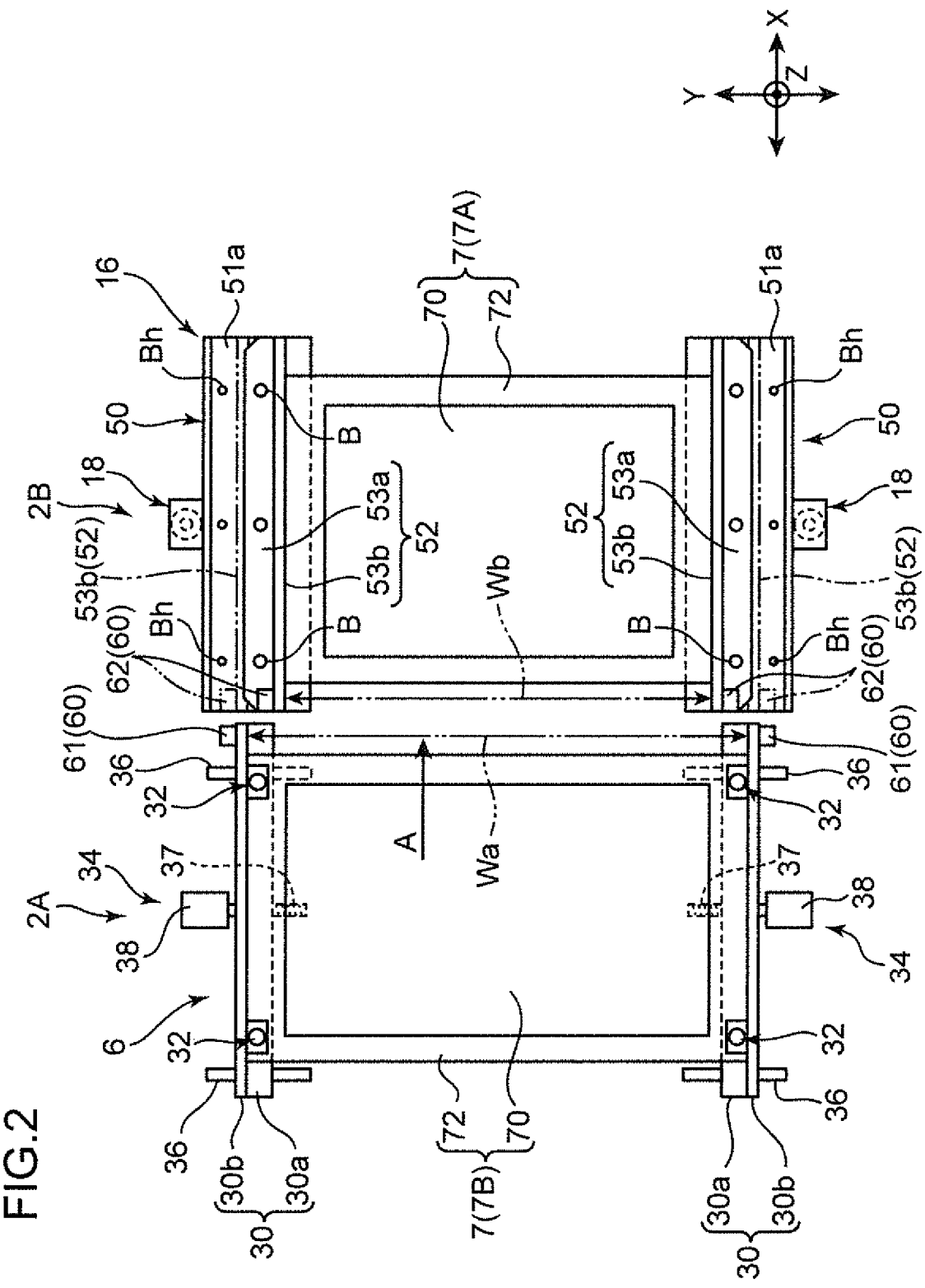
FIG. 2 is a schematic plan view of a printing work part and a mask storage part.

The mask holding unit 6 is disposed above the substrate holding unit 8. The mask holding unit 6 holds a screen mask 7 (hereinafter referred to as a mask 7 in short). As shown in FIG. 2, the mask 7 has a rectangular shape (oblong or square) in a plan view, and has a mask body 70 made of a thin metal plate in which an opening for printing is formed, and a frame body 72 made of a metal (e.g., aluminum), the frame body 72 having this mask body 70 stretched thereon.

The mask holding unit 6 includes a pair of guide members 30 extending parallel to each other in the X direction and disposed at an interval in the Y direction, mask clamping devices 32 for clamping the mask 7 to the pair of guide members 30, and interval varying mechanisms 34 for changing the interval between the pair of guide members 30. Note that in FIG. 1, the mask clamping devices 32 and the interval varying mechanism 34 are omitted for convenience.

As shown in FIG. 2, each of the guide members 30 is a member having an L-shaped cross section, each of the guide members including a support part 30a having a support surface that supports the mask 7, and a guide part 30b having a guide surface that restricts the screen mask 7 from an outside in the Y direction, and being made of a metal material such as stainless steel or the like.

The mask clamping devices 32 are provided in each of the guide members 30. Although a detailed view is omitted, each of the mask clamping devices 32 is configured of a clamp plate and an air cylinder that drives the clamp plate forward and backward, and sandwiches the mask 7 (a portion of the frame body 72) between the support part 30a of the guide member and the clamp plate to thereby fix the relevant mask 7 to the guide member 30. In this example, for each of the guide members 30, the two mask clamping devices 32 are provided at a predetermined interval in the X direction (in a longitudinal direction of the guide member 30).

Each of the interval varying mechanisms 34 is a screw feed mechanism. Specifically, each of the interval varying mechanisms 34 includes a pair of rails 36 that extends in the Y direction, and movably supports the guide member 30, a screw shaft 37 that extends in the Y direction and is screwed into a nut member (not shown) fixed to the guide member 30, and a servomotor 38 that drives this screw shaft 37. That is, the interval varying mechanism 34 is configured to move the guide member 30 along the rails 36 by rotationally driving the screw shaft 37 by the servomotor 38. Note that the pair of rails 36, the screw shaft 37, the nut member, and the servomotor 38 are provided for each of the guide members 30.

The printing unit 10 is provided movably above the mask holding unit 6. This printing unit 10 moves the paste along an upper surface of the mask 7 (mask body 70). Examples of the paste include conductive binders such as a cream solder and a conductive paste.

The printing unit 10 is provided movably in the X direction by a screw feed mechanism. Specifically, the printing unit 10 has a beam 11 extending in the Y direction, and both ends of this beam 11 are movably supported by a rail 40 extending in the X direction. Nut members are incorporated in both the ends of the beam 11, and a screw shaft 42 extending in the X direction is screwed into these nut members and joined to a servomotor 44. The screw shaft 42 is rotationally driven by the servomotor 44, by which the printing unit 10 is moved in the X direction along the rail 40.

Note that the rail 40 and the screw shaft 42 extend in the X direction from a position of the printing work part 2A to a position of the mask storage part 2B. Moreover, the beam 11 has a length dimension capable of traveling in the mask holding unit 6 and a mask stocker 16 described later in the Y direction. Accordingly, the printing unit 10 is movable in the X direction from the printing work part 2A to the mask storage part 2B.

The printing unit 10 is further provided with a squeegee 12 and a mask slider 14. The squeegee 12 is a metal plate-shaped member having a pressing surface for pressing the paste. The paste moves on the mask 7 by being pressed by the squeegee 12. The squeegee 12 reciprocates in the X direction integrally with the printing unit 10, and a posture thereof is changed between in forward movement and in backward movement so that the pressing surface is directed forward in a traveling direction. Further, the squeegee 12 is movable in the Z direction to a position where the squeegee can slide on the mask body 70 (position indicated by a two-dot chain line in FIG. 1) and a position where the squeegee is retracted above the mask 7.

The mask slider 14 is for moving the mask 7 between the printing work part 2A and the mask storage part 2B.

The mask slider 14 includes a pin 14a extending in the Z direction, and a drive part 14b (see FIG. 5) such as an air cylinder for driving this pin 14a forward and backward in the Z direction. The pin 14a is provided displaceably between a predetermined projecting position (lowered position) where a tip (lower end) of the pin 14a is lower than the upper surface of the mask 7 supported by the guide member 30 and higher than the upper surface of the mask body 70, and a retracted position (elevated position) where the tip is retracted above the mask 7. In FIG. 1, a position indicated by a solid line is the projecting position of the pin 14a, and the position indicated by the two-dot chain line is the retracted position of the pin 14a. That is, the mask slider 14 moves the mask 7 in the X direction with the movement of the printing unit 10 by hooking the pin 14a on the frame body 72. In this example, the printing unit 10 including the mask slider 14 corresponds to a "transfer device" of the present disclosure.

On the other hand, the mask stocker 16 is disposed in the mask storage part 2B. The mask stocker 16 accommodates a plurality of masks 7.

Figure 3:
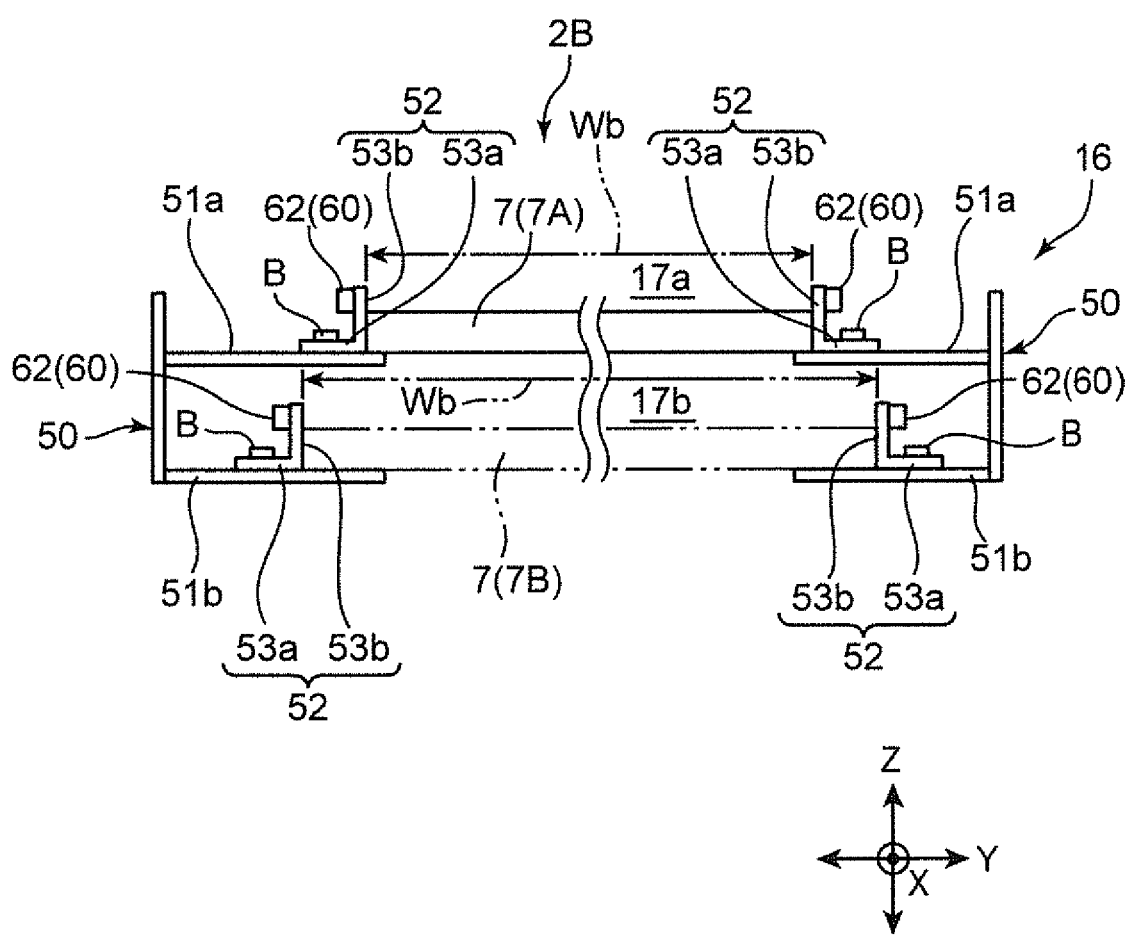
FIG. 3 is a view on arrow A in FIG. 2 showing the mask storage part (a mask stocker)

As shown in FIGS. 1 to 3, the mask stocker 16 has upper and lower accommodating sections 17a, 17b for accommodating the masks 7, and two types of masks 7 different in pattern of the mask opening and size are accommodated in these accommodating sections 17a, 17b. Specifically, the mask 7 having a smaller size (referred to as a first mask 7A as appropriate) is accommodated in the upper accommodating section 17a (referred to as a first accommodating section 17a), and the mask 7 having a larger size than the first mask 7A (referred to as a second mask 7B as appropriate) is accommodated in the lower accommodating section 17b (referred to as a second accommodating section 17b). Note that FIGS. 1 to 3 show a state in which the second mask 7B is disposed in the printing work part 2A, and only the first mask 7A is accommodated in the mask stocker 16.

The mask stocker 16 is configured of a pair of mask support frames 50 disposed at a predetermined interval in the Y direction and made of a metal material such as aluminum or the like. Each of the mask support frames 50 includes an upper shelf part 51a having a flat and horizontal support surface, a lower shelf part 51b having a similar support surface, and guide members 52 fixed to each of the shelf parts 51a, 51b. The shelf parts 51a, 51b and the guide members 52 extend in the X direction with an equivalent length.

Each of the guide members 52 is a member having an L-shaped cross section, the guide member 52 including a guide part 53b having a guide surface that restricts the mask 7 from the outside in the Y direction, and a fixing part 53a that fixes the guide member 52 to each of the shelf parts 51a, 51b, and the relevant guide member 52 is fixed to each of the shelf parts 51a, 51b by bolts B via the fixing part 53a. As shown in FIG. 3, the guide surface of the guide part 53b and the support surface of each of the shelf parts 51a, 51b are provided at a right angle, and the fixing part 53a extends outward (outward in the Y direction) from the guide part 53b. With this configuration, the first mask 7A is accommodated in the first accommodating section 17a in a state where both ends thereof are supported by the respective upper shelf parts 51a, and are restricted from the outside in the Y direction by the guide parts 53b of the guide members 52. Moreover, the second mask 7B is accommodated in the second accommodating section 17b in a state where both ends thereof are supported by the respective lower shelf parts 51b, and are restricted from the outside in the Y direction by the guide parts 53b of the respective guide members 52.

Note that in each of the shelf parts 51a, 51b, two screw rows including a plurality of screw holes Bh arranged in the X direction at predetermined intervals are provided at a predetermined interval in the Y direction. These screw rows are for fixing the guide members 52, and an interval between the guide members 52 can be changed in two stages, that is, narrower and wider stages, depending on which of the screw holes Bh in the inner or outer screw rows are used. In this example, for each of the upper shelf parts 51a, the guide member 52 is fixed using the screw holes Bh in the inner screw row, so that the interval between the guide members 52 becomes a narrow interval corresponding to the first mask 7A, and as for the lower shelf part 51b, the guide members 52 are fixed using the screw holes Bh in the outer screw rows, so that the interval between the guide members 52 becomes a wider interval corresponding to the second mask 7B.

Each of the mask support frames 50 is supported by a device frame (not shown) so as to be freely elevated and lowered, and is connected to an air cylinder 18. Driving the air cylinders 18 synchronously allows both the mask support frames 50 to be integrally elevated and lowered. That is, the mask stocker 16 is configured so as to be able to be elevated and lowered by drive of the air cylinder 18 between a lowered position where the first accommodating section 17a corresponds to the mask holding unit 6 and an elevated position where the second accommodating section 17b corresponds to the mask holding unit 6. The lowered position is a position where a position of the support surface of the support part 30a of the guide member 30 is equal to a position of the support surface of the upper shelf part 51a in the Z direction, and the elevated position is a position where the position of the support surface of the support part 30a of the guide member 30 is equal to a position of the support surface of the lower shelf part 51b in the Z direction.

Note that a photoelectric sensor 60 is provided on each of the guide members 30 of the mask holding unit 6 and each of the guide members 52 of the accommodating sections 17a, 17b of the mask stocker 16. The photoelectric sensor 60 is for detecting whether or not an interval between the guide parts 30b of the pair of guide members 30 (e.g., a guide width) and an interval between the guide parts 53b of the pair of guide members 52 coincide with each other.

As shown in FIG. 2, the photoelectric sensor 60 includes a sensor body 61 having a light projecting part and a light receiving part, and a reflecting plate 62 as an object to be detected. The sensor body 61 is fixed to an end of each of the guide members 30 on a mask storage part 2B side (right end in FIG. 2), and the reflecting plate 62 is an end of each of the guide members 52 on a printing work part 2a side (left end in FIG. 2). The sensor body 61 and the reflecting plate 62 are both fixed to side surfaces of the guide parts 30b, 53b on the opposite side of the guide surfaces.

That is, when an interval Wa between the respective guide parts 30b of the pair of guide members 30 and an interval Wb between the respective guide parts 53b of the pair of guide members 52 coincide with (are equal to) each other, each of the sensor bodies 61 and each of the reflecting plates 62 are opposed to each other in the X direction, by which light projected from the relevant sensor body 61 is reflected by the relevant reflecting plate 62 and received by the relevant sensor body 61. That is, the reflecting plate 62 is detected. This allows the sensor body 61 to output a predetermined Hi level signal. On the other hand, when the interval Wa between the respective guide parts 30b of the pair of guide members 30 and the interval Wb between the respective guide parts 53b of the pair of guide members 52 do not coincide with each other, the sensor bodies 61 and the reflecting plates 62 are out of alignment in the Y direction. Therefore, the light projected from each of the sensor bodies 61 is not reflected by each of the reflecting plates 62, that is, the relevant reflecting plate 62 is not detected, and the relevant sensor body 61 outputs a Lo level signal at a level lower than the Hi level signal. In a control device 80 (arithmetic processing unit 81) described later, based on the output signal from each of these photoelectric sensors 60, it is determined whether or not the interval between the guide parts 30b of the pair of guide members 30 and the interval between the guide parts 53b of the pair of guide members 52 coincide with each other. In this example, the photoelectric sensor 60 and the control device 80 (an arithmetic processing unit 81) correspond to a "guide width determination device" of the present disclosure, and the photoelectric sensor 60, the sensor body 61, and the reflecting plate 62 correspond to a "sensor", a "detecting part" and a "detected part", respectively.

Reference sign 4 in FIG. 1 denotes a camera unit. This camera unit 4 includes a camera 4*a* for capturing an image of the substrate P held by the substrate holding unit 8, an illumination device, and the like. The camera unit 4 is provided movably in the X direction from a position located between the mask holding unit 6 and the substrate holding unit 8 in a state where the substrate P held by the substrate holding unit 8 is separated from the mask 7 (state shown in FIG. 1) to a position under the mask stocker 16 retracted from this position.

An outline of printing operation by the printing device 1 is as follows. That is, the substrate P is held by the upper unit 8A of the substrate holding unit 8, and is overlapped and mounted on a lower surface of the mask 7 with actuation of the lower unit 8B. In this state, the printing unit 10 reciprocates in the X direction, so that the squeegee 12 moves the paste on the mask body 70. As a result, the paste is applied (printed) to the substrate P. The substrate P after the printing is separated from the mask 7 by the actuation of the lower unit 8B, and is carried out downstream from the printing work part 2 by actuation of the conveyor 20 of the upper unit 8A. If necessary, the mask 7 of the printing work part 2 is replaced with the mask 7 in the mask stocker 16 between the above-described printing work.

As shown in FIG. 1, the printing device 1 includes the control device 80 that comprehensively controls the entire device. The control device 80 includes the arithmetic processing unit 81, a drive control unit 82, a storage unit 83, an input/output control unit 84, and the like.

The arithmetic processing unit 81 is configured of a CPU or the like, and controls operation of each of the parts of the printing device 1 such as the printing unit 10 and the like via the drive control unit 82 in accordance with a printing program stored in advance in the storage unit 83 to execute the above-described printing processing. Moreover, the arithmetic processing unit 81 executes mask replacement processing described later in accordance with a mask replacement program stored in the storage unit 83 based on command input through an operation of an input device (not shown) by an operator, or based on production plan information input in advance.

The input/output control unit 84 controls input and output of signals between the control device 80, and various sensors and actuators, and the sensor bodies 61 of the photoelectric sensors 60 are connected to the input/output control unit 84. Moreover, a warning light/speaker 85 is connected to the input/output control unit 84. The warning light/speaker 85 notifies the operator of occurrence of a trouble in the printing device 1 by light and sound.

Figure 4:
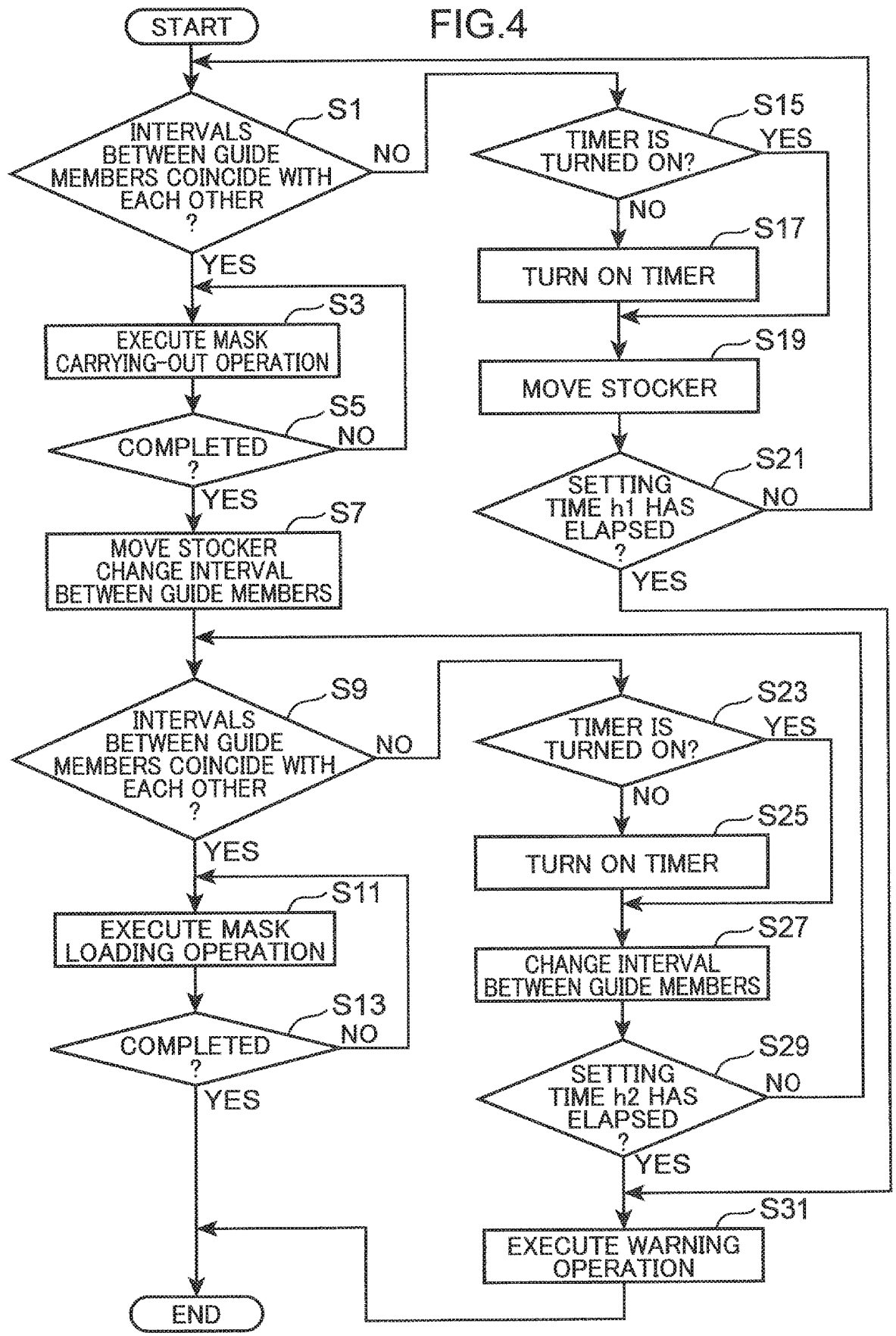
FIG. 4 is a flowchart for describing screen mask replacement processing control.

Next, control of the mask replacement processing by the arithmetic processing unit 81 will be described based on a flowchart of FIG. 4 with reference to FIGS. 5 to 10.

In the following description, the guide member 30 of the mask holding unit 6 is referred to as a "first guide member 30", and the "guide member 52" of the mask stocker 16 is referred to as a "second guide member 52". Moreover, the printing device 1 is in the state shown in FIG. 1, that is, in the state where the second mask 7B is set in the printing work part 2 and the first mask 7A is accommodated in the mask stocker 16, and in the state where the mask stocker 16 is disposed at the elevated position. Note that the broken line (reference sign Rf) in FIGS. 5 to 10 indicates the position of the support surface of the support part 30*a* of the first guide member 30.

This control is started, for example, by inputting a command to execute the mask replacement processing. When this control starts, based on the output signals from the photoelectric sensors 60 (sensor bodies 61), the arithmetic processing unit 81 first determines whether the interval between the pair of first guide members 30 and the interval between the pair of second guide members 52 on the mask stocker 16 side coincide with each other, or correctly, whether the interval Wa between the guide parts 30*b* of the pair of first guide members 30 and the interval Wb between the guide parts 53*b* of the pair of second guide members 52 coincide with each other (step S1). Note that in the following description, these intervals may be simply referred to as "the interval between the first guide members 30" and "the interval between the second guide members 52".

Specifically, if the output signal from each of the sensor bodies 61 is the Hi level signal, the arithmetic processing unit 81 determines that the interval Wa between the first guide members 30 and the interval Wb between the second guide members 52 coincide with each other, and if the output signal is the Lo level signal, the arithmetic processing unit 81 determines that the interval Wa between the first guide members 30 and the interval Wb between the second guide members 52 do not coincide with each other.

If Yes is determined in step S1, the arithmetic processing unit 81 controls the printing unit 10 and the like to execute mask carrying-out operation (step S3).

Figure 5:
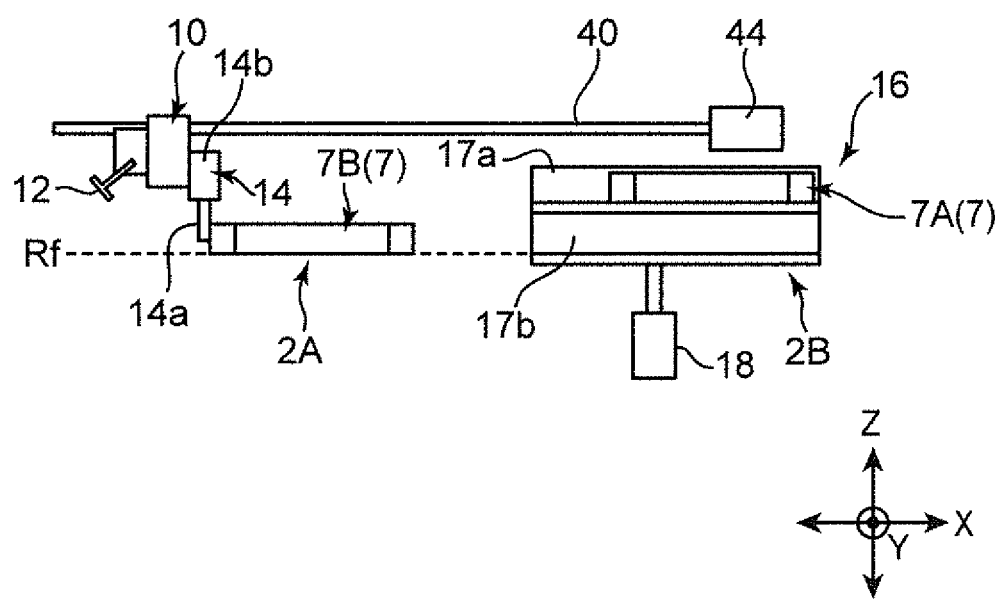
FIG. 5 is an explanatory view of screen mask replacing operation (a state where a printing unit is located at a transfer start position in the printing work part)
Figure 6:
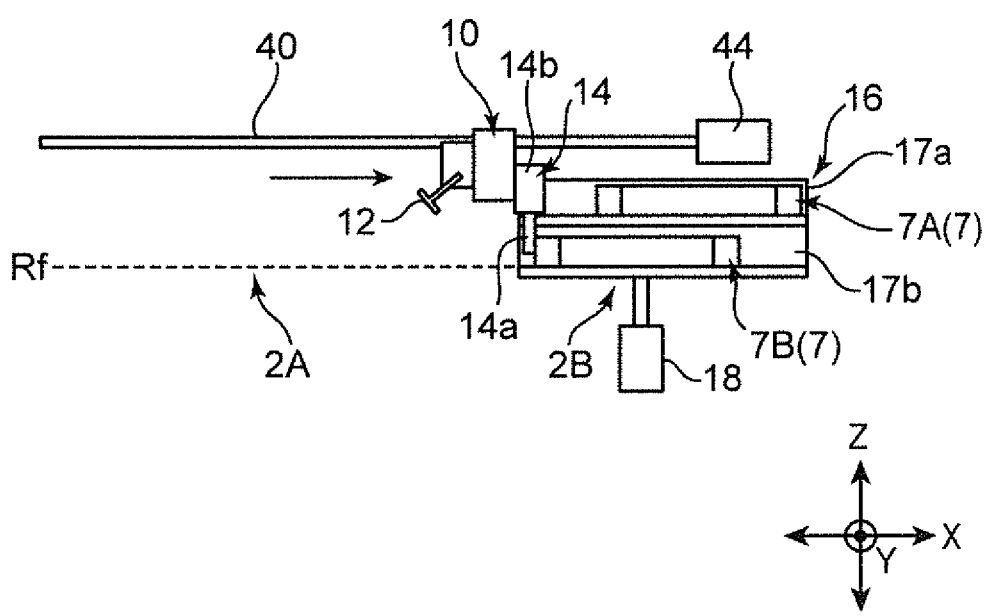
FIG. 6 is an explanatory view of the screen mask replacing operation (a state where a second mask is accommodated in the mask stocker)
Figure 7:
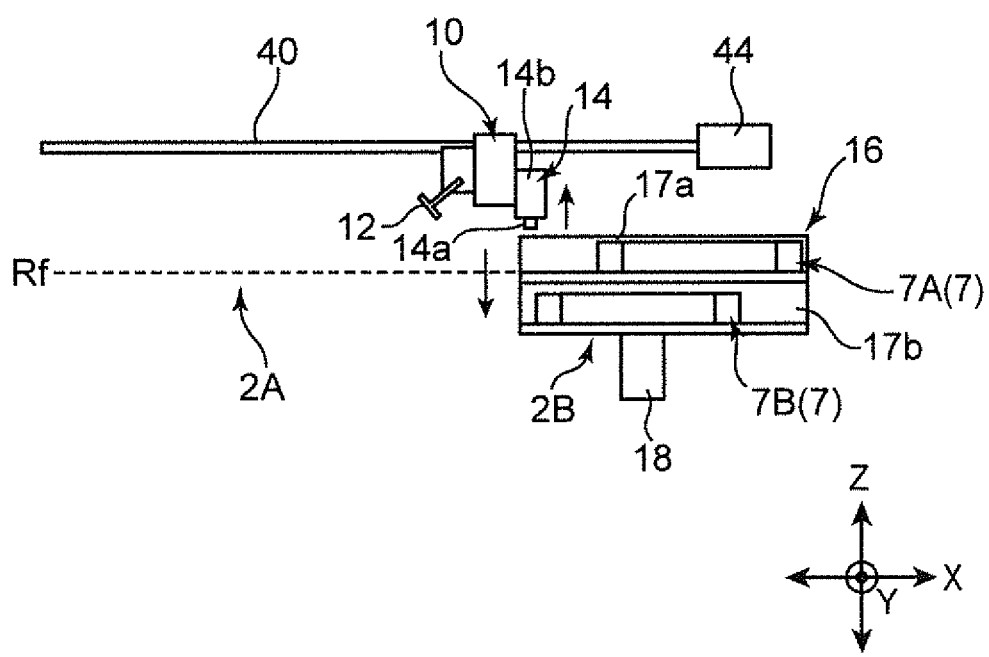
FIG. 7 is an explanatory view of the screen mask replacing operation (a state where the mask stocker is located at a lowered position)

Particularly, the printing unit 10 is moved so that the pin 14*a* of the mask slider 14 is located on the opposite side of the mask storage part 2B with respect to the second mask 7B, and the mask slider 14 is actuated there to dispose the pin 14*a* at the projecting position (see FIG. 5). After releasing a clamped state of the second mask 7B by the mask clamping devices 32, the printing unit 10 is moved toward the mask storage part 2B. That is, the pin 14*a* is hooked on the second mask 7B, and moves the second mask 7B together with the printing unit 10 in the X direction. Thereby, the second mask 7B is transferred from the mask holding unit 6 to the second accommodating section 17*b* of the mask stocker 16 (see FIG. 6). At this time, the second mask 7B is smoothly accommodated in the second accommodating section 17*b* while being guided along the guide part 30*b* of each of the first guide members 30 and the guide part 53*b* of each of the second guide members 52. Note that since the upper and lower masks 7A, 7B need to be transferred by the common pin 14*a* of the mask slider 14, a accommodated position of the first mask 7A accommodated in the upper stage is offset from a accommodated position of the second mask 7B to an outside in the X direction (opposite side of the printing work part 2A) so as not to disturb taking in and out of the second mask 7B to be accommodated in the lower stage.

Next, the arithmetic processing unit 81 determines whether or not the accommodating of the second mask 7B has been completed (step S5), and if Yes is determined here, the mask stocker 16 is moved from the elevated position to the lowered position (see FIG. 7), the interval between the first guide members 30 is changed to an interval corresponding to the first mask 7A (step S7). At this time, the pin 14*a* of the mask slider 14 is moved from the projecting position to the retracted position. Note that whether or not the accommodating of the second mask 7B has been completed is determined based on output information from a sensor (not shown) disposed in the second accommodating section 17*b* or output information from a position detection device such as an encoder or the like incorporated in the servomotor 44.

Next, the arithmetic processing unit 81 determines whether the interval Wa between the first guide members 30 and the interval Wb between the second guide members 52 on the mask stocker 16 side coincide with each other based on the output signals from the sensor bodies 61 (step S9).

Figure 8:
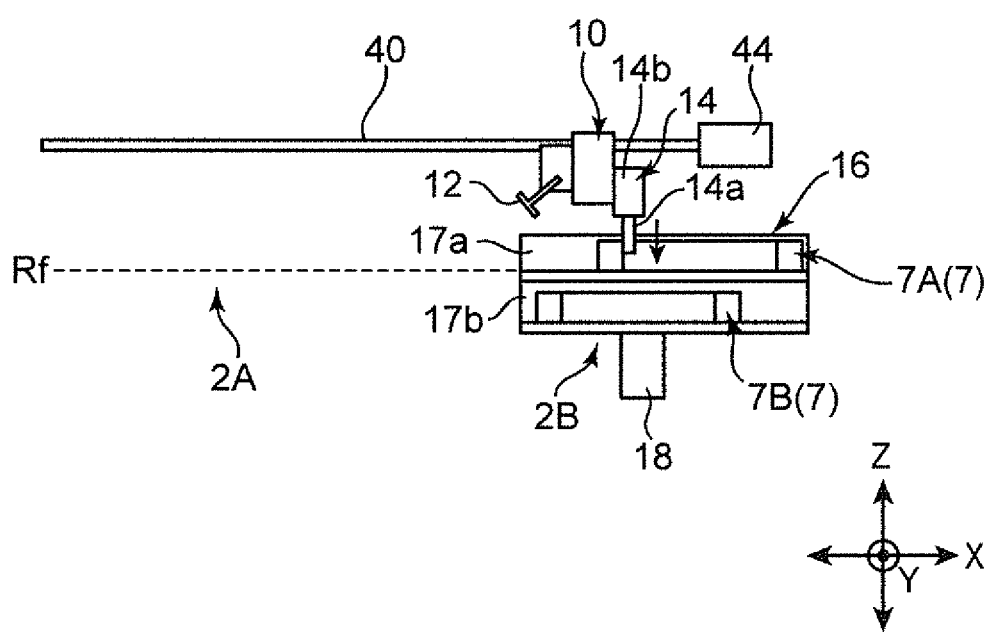
FIG. 8 is an explanatory view of the screen mask replacing operation (a state where the printing unit is located at a transfer start position in the mask storage part)
Figure 9:
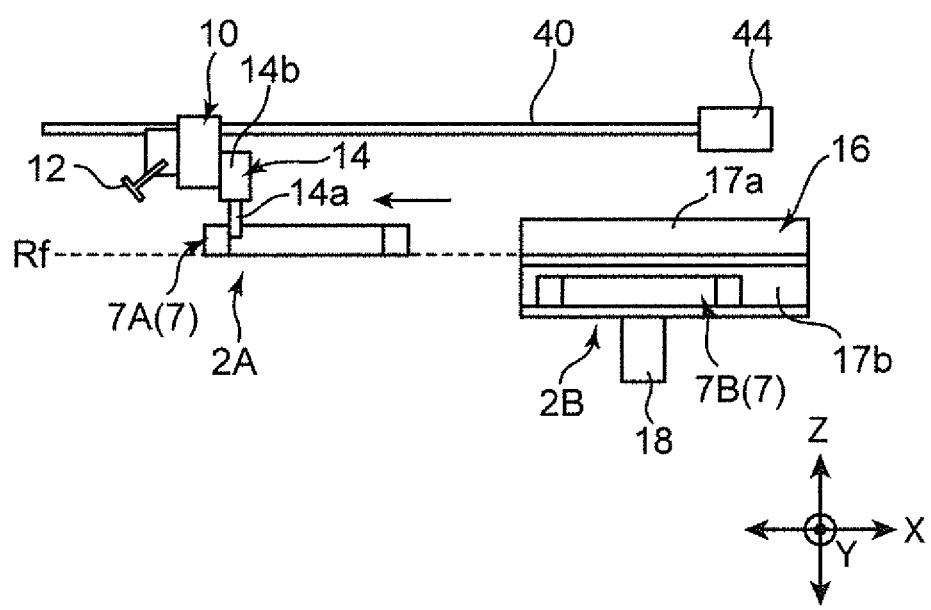
FIG. 9 is an explanatory diagram of the screen mask replacing operation.

Here, if Yes is determined, the arithmetic processing unit 81 controls the printing unit 10 and the like to execute mask loading operation (step S11). Particularly, the printing unit 10 is moved so that the pin 14*a* of the mask slider 14 is located inside the frame body 72 of the first mask 7A, and the mask slider 14 is actuated there to dispose the pin 14*a* at the projecting position (FIG. 8). Next, the printing unit 10 is moved toward the printing work part 2. That is, the pin 14*a* is hooked on the frame body 72 from an inside of the first mask 7A, and moves the first mask 7A in the X direction together with the printing unit 10. Thereby, the first mask 7A is transferred from the first accommodating section 17*a* of the mask stocker 16 to the mask holding unit 6 (see FIG. 9). At this time, the first mask 7A is smoothly transferred to the mask holding unit 6 while being guided along the guide part 53*b* of each of the second guide members 52 of the first accommodating section 17*a* and the guide part 30*b* of each of the first guide members 30.

Next, the arithmetic processing unit 81 determines whether or not the transfer of the first mask 7A to the mask holding unit 6 has been completed (step S13), and if Yes is determined, the arithmetic processing unit 81 causes the pin 14*a* of the mask slider 14 to move from the projecting position to the retracted position, and actuates the mask clamping devices 32 to fix the first mask 7A to each of the first guide members 30, and then ends this flowchart. Note that whether or not the transfer of the first mask 7A has been completed is determined by the output information from the sensor (not shown) disposed in the mask holding unit 6, or from the output information from the position detection device such as an encoder or the like incorporated in the servomotor 44.

On the other hand, if No is determined in step S1, that is, if it is determined that the interval Wa between the guide parts 30*b* of the first guide members 30 and the interval Wb between the guide parts 53*b* of the second guide members 52 do not coincide with each other, the arithmetic processing unit 81 determines whether a timer is turned on (step S15), and if No is determined here, the timer is turned on (step S17), and then, the air cylinder is actuated to move the mask stocker 16 (step S19). Then, it is determined whether or not a predetermined time h1 has elapsed (step S21), and if No is determined here, the processing shifts to step S1. That is, if the interval Wa between the guide parts 30*b* of the first guide members 30 and the interval Wb between the guide parts 53*b* of the second guide members 52 do not coincide with each other, a correspondence relation between the first guide members 30 and each of the accommodating sections 17*a*, 17*b* of the mask stocker 16 does not coincide with each other, and thus, the arithmetic processing unit 81 moves the mask stocker 16 to solve this.

In this manner, if before the predetermined time h1 has elapsed, it is determined that the interval Wa between the first guide members 30 and the interval Wb between the second guide members 52 coincide with each other (if Yes is determined in Step S1), the arithmetic processing unit 81 shifts the processing to step S3. On the other hand, if before the predetermined time h1 has elapsed, it is not determined that the interval Wa between the first guide members 30 and the interval Wb between the second guide members 52 coincide with each other, the arithmetic processing unit 81 actuates the warning light/speaker 85 at the time point when the relevant predetermined time h1 has elapsed (step S31), and then ends this flowchart.

Moreover, if No is determined in step S9, that is, if it is determined that the interval Wa between the guide parts 30*b* of the first guide members 30 does not coincide with the interval Wb between the guide parts 53*b* of the second guide members 52 of the first accommodating section 17*a*, the arithmetic processing unit 81 first determines whether the timer is turned on (step S23), and if No is determined here, the arithmetic processing unit 81 turns on the timer (step S25), and then actuates the servomotor 38 to move each of the first guide members 30 (step S27). Then, it is determined whether or not a predetermined time h2 has elapsed (step S29), and if No is determined here, the processing shifts to step S9. For example, if an amount of movement of each of the first guide members 30 in step S7 is incomplete, the interval Wa between the first guide members 30 and the interval Wb between the second guide members 52 may not coincide with each other, and thus, the arithmetic processing unit 81 moves each of the first guide members 30 in order to solve this.

In this manner, if before the predetermined time h2 has elapsed, it is determined that the interval Wa between the first guide members 30 and the interval Wb between the second guide members 52 coincide with each other (if Yes is determined in step S9), the arithmetic processing unit 81 shifts the processing to step S11. On the other hand, if before the predetermined time h2 has elapsed, it is not determined that the interval Wa between the first guide members 30 and the interval Wb between the second guide members 52 coincide with each other, the arithmetic processing unit 81 shifts the processing to step S31 at a time point when the relevant predetermined time h2 has elapsed, and actuates the warning light/speaker 85, and then ends this flowchart.

As described above, according to the printing device 1, when the mask 7 is replaced, based on the output signals from the photoelectric sensors 60 (the sensor bodies 61), it is determined by the arithmetic processing unit 81 whether or not the interval Wa between the first guide members 30 in the printing work part 2A (the mask holding unit 6) and the interval Wb between the second guide members 52 in the mask storage part 2B (the mask stocker 16) coincide with each other. If the interval Wa between the first guide members 30 and the interval Wb of the second guide members 52 do not coincide with each other, and if this is not solved before the predetermined time h1 or h2 has elapsed, the warning light/speaker 85 is actuated and the transfer operation of the mask 7 is stopped. Accordingly, it is possible to prevent occurrence of a trouble due to the transfer of the mask 7 in the state where the interval Wa between the first guide members 30 and the interval Wb between the second guide members 52 do not coincide with each other.

Figure 10:
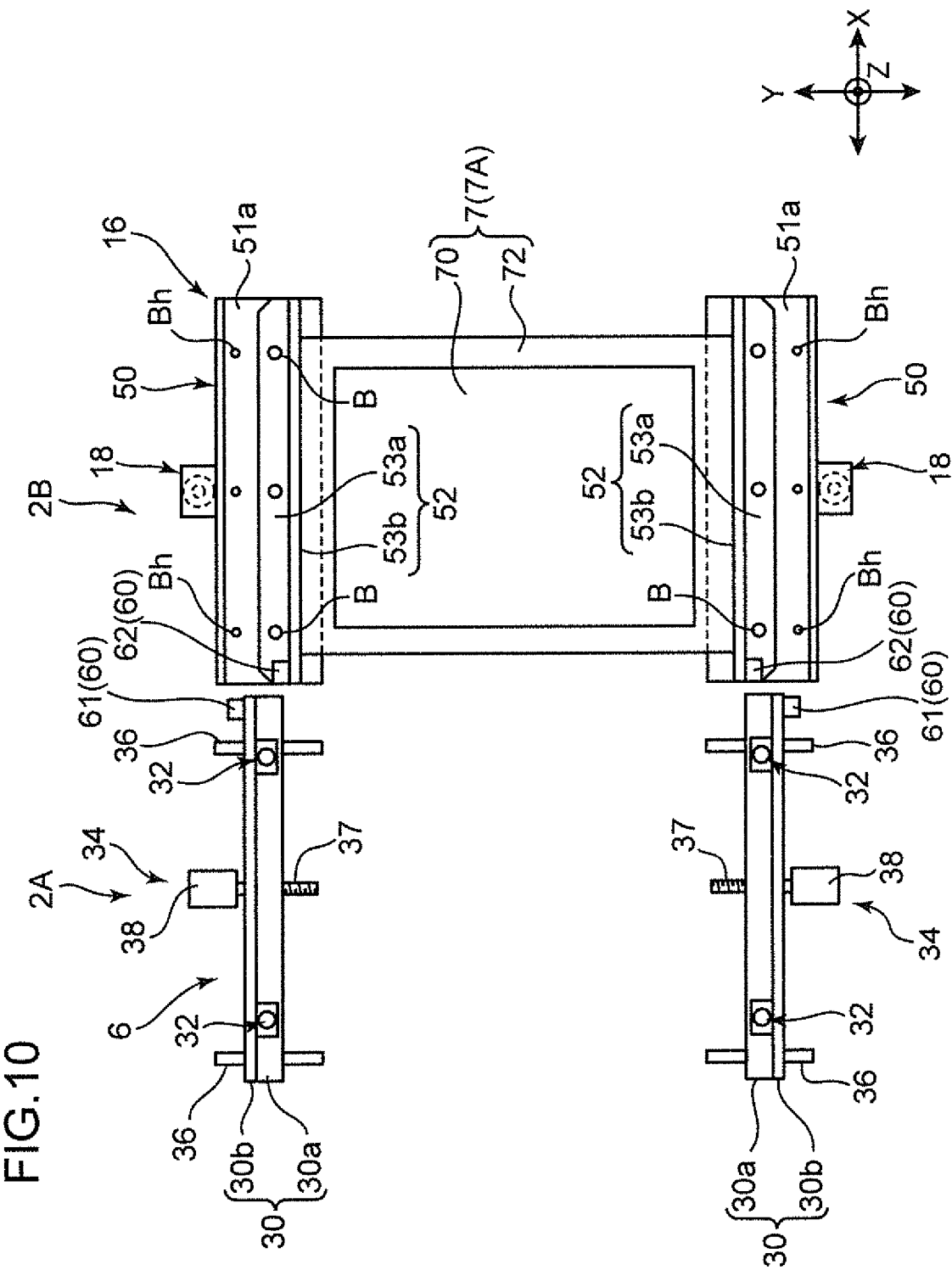
FIG. 10 is a schematic plan view of the printing work part and the mask storage part (a state where an interval between guide members of a mask holding unit and an interval between guide members of the mask stocker do not coincide with each other).

For example, during transfer of the second mask 7B from the mask holding unit 6 to the mask stocker 16, the second mask 7B is prevented from colliding with the second guide members 52 of the first accommodating section 17*a* and being damaged. Moreover, the first mask 7A is prevented from falling onto the substrate holding unit 8 from between both the first guide members 30 and damaging the substrate holding unit 8 and the first mask 7A due to start of the transfer of the first mask 7A from the mask stocker 16 while the interval Wa between the first guide members 30 remains the interval Wb corresponding to the second mask 7B, as shown in FIG. 10.

Moreover, according to this printing device 1, the configuration is employed in which the photoelectric sensor 60 (the sensor body 61, the reflecting plate 62) is attached to each of the first guide members 30 of the mask holding unit 6 and each of the second guide members 52 of the mask stocker 16, and the arithmetic processing unit 81 determines whether or not the interval Wa between the first guide members 30 and the interval Wb between the second guide members 52 coincide with each other based on the output signal from the photoelectric sensor 60. Therefore, the above actions and effects can be achieved with a simple configuration.

In particular, the configuration is such that while the sensor body 61 is attached to the end of each of the first guide members 30, the reflecting plate 62 is attached to the end of each of the second guide members 52, and that when the interval between the first guide members 30 and the interval between the second guide members 52 coincide with each other, the sensor body 61 detects the reflecting plate 62 (outputs the Hi level signal), so that the structure is also very simple. Therefore, there is an advantage that maintenance such as replacement of the photoelectric sensor 60 due to a failure is easy.

The printing device 1 described above is an example of a preferred embodiment of the screen printing device according to the present disclosure, and the specific configuration of the printing device 1 can be appropriately changed without departing from the gist of the present disclosure.

For example, in the printing device 1, the photoelectric sensor is applied as the "sensor" of the present disclosure, but the type of the "sensor" is not limited to this. Other various sensors (including a camera) are also applicable. Moreover, the present disclosure is not limited to the sensor having the dedicated detected part (reflecting plate 62) as in the printing device 1, but may be a device that directly detects a part of the second guide member 52 as a detected part. Accordingly, a proximity switch of an induction type, a capacitance type, a magnetic type, or the like, or a sensor such as a Hall element or the like can be applied. Further, not only a non-contact type sensor but also a contact type sensor such as a microswitch or the like can be applied.

Moreover, the printing device 1 is configured to transfer the mask 7 by using the point that the printing unit 10 moves in the X direction and by providing the printing unit 10 with the mask slider 14. However, a configuration including a dedicated transfer device for transferring the mask 7 separately from the printing unit 10 may be employed.

Moreover, while in the mask stocker 16 of the above-described printing device 1, the interval between the second guide members 52 can be changed by attaching and detaching the bolts B, for example, a configuration may be employed in which similar to the first guide members 30 of the mask holding unit 6, the interval between the second guide members 52 is changed by a screw feed mechanism or the like. According to this configuration, a freedom degree of the interval between the second guide members 52 is increased, so that the masks 7 having a wider range of sizes can be accommodated. In this case, in the processing of step S19 in FIG. 4, the second guide members 52 may be moved in addition to the movement of the mask stocker 16.

As described above, the present disclosure described according to the embodiment is summarized as follows.

A screen printing device of the present disclosure includes a printing work part in which printing work is executed; a mask storage part that is disposed on a side of the printing work part and includes a plurality of accommodating sections each capable of accommodating a screen mask; a transfer device that moves the screen mask in a first direction to transfer the screen mask between each of the accommodating sections of the mask storage part, and the printing work part, the first direction being horizontal; a pair of first guide members that is disposed at an interval in a second direction orthogonal to the first direction in the printing work part, and guides the screen mask during the transfer, the pair of first guide members having a variable interval; a pair of second guide members that is disposed at an interval in the second direction orthogonal to the first direction in each of the accommodating sections of the mask storage part, and guides the screen mask during the transfer; and a guide width determination device that determines whether or not the interval between the pair of first guide members coincides with the interval between the pair of second guide members before the transfer of the screen mask by the transfer device is started.

In this screen printing device, when the screen mask is transferred by the transfer device with the replacement of the screen mask, it is determined by the guide width determination device whether or not the interval between the first guide members on the printing work part side and the interval between the second guide members on the mask storage part (accommodating section) side coincide with each other. Therefore, controlling the transfer device or the like based on an above determination result can prevent the screen mask from being transferred in a state where the interval between the first guide members and the interval between the second guide members do not coincide with each other.

In this configuration, the guide width determination device includes a sensor configured of a detecting part attached to one side of each of the first guide members and each of the second guide members, and a detected part attached to another side of each of the first guide members and each of the second guide members, and in a case where each of the detecting parts has detected each of the detected parts, the guide width determination device determines that the interval between the pair of first guide members coincides with the interval between the pair of second guide members.

According to this configuration, it is possible to determine whether or not the interval between the first guide members and the interval between the second guide members coincide with each other with the simple configuration using the sensor configured of the detecting part and the detected part.

In this case, it is preferable that the detecting part and the detected part are attached at positions opposed to each other in the first direction in a state where the interval between the pair of first guide members coincides with the interval between the pair of second guide members, and that the detecting part detects the detected part at the position opposed to the detected part in the first direction.

According to this configuration, a simpler configuration can be achieved in which the attachment positions of the detecting part and the detected part are simple.

It is preferable that the above-described screen printing device includes a notification device that notifies determination when the guide width determination device determines that the interval between the pair of first guide members does not coincide with the interval between the pair of second guide members.

According to this configuration, it is possible for an operator or the like to promptly recognize the state where the interval between the first guide members does not coincide with the interval between the second guide members.

What is claimed is:

1. A screen printing device comprising:
    a printing work part in which printing work is executed;
    a mask storage part that is disposed on a side of the printing work part and includes a plurality of accommodating sections each capable of accommodating a screen mask;
    a transfer device configured to move the screen mask in a first direction to transfer the screen mask between each of the accommodating sections of the mask storage part, and the printing work part, the first direction being horizontal;
    a pair of first guide members that is disposed at an interval in a second direction orthogonal to the first direction in the printing work part, and configured to guide the screen mask during the transfer, the pair of first guide members having a variable interval;
    a pair of second guide members that is disposed at an interval in the second direction orthogonal to the first direction in each of the accommodating sections of the mask storage part, and configured to guide the screen mask during the transfer; and
    a guide width determination device configured to determine whether or not the interval between the pair of first guide members coincides with the interval between the pair of second guide members before the transfer of the screen mask by the transfer device is started.

2. The screen printing device according to claim 1, wherein
    the guide width determination device includes a sensor comprising a plurality of detecting parts, each of the detecting parts being attached to one side of each of the first guide members and each of the second guide members, and a plurality of detected parts, each of the detected parts being attached to another side of each of the first guide members and each of the second guide members, and in a case where each of the detecting parts has detected each of the detected parts, the guide width determination device determines that the interval between the pair of first guide members coincides with the interval between the pair of second guide members.

3. The screen printing device according to claim 2, wherein
    each of the detecting parts and the detected parts are attached at positions opposed to each other in the first direction in a state where the interval between the pair of first guide members coincides with the interval between the pair of second guide members, and
    the detecting parts are configured to detect the detected parts at the positions opposed to the detecting parts in the first direction.

4. The screen printing device according to claim 1, comprising
    a notification device configured to notify a determination when the guide width determination device determines that the interval between the pair of first guide members does not coincide with the interval between the pair of second guide members.

5. The screen printing device according to claim 2, comprising
    a notification device configured to notify a determination when the guide width determination device determines that the interval between the pair of first guide members does not coincide with the interval between the pair of second guide members.

6. The screen printing device according to claim 3, comprising
    a notification device configured to notify a determination when the guide width determination device determines that the interval between the pair of first guide members does not coincide with the interval between the pair of second guide members.

* * * * *